US007743877B2

(12) United States Patent
Saiki et al.

(10) Patent No.: US 7,743,877 B2
(45) Date of Patent: Jun. 29, 2010

(54) SPEAKER SYSTEM

(75) Inventors: Shuji Saiki, Nara (JP); Toshiyuki Matsumura, Osaka (JP)

(73) Assignee: Panasonic Corporation, Osaka (JP)

( * ) Notice: Subject to any disclaimer, the term of this patent is extended or adjusted under 35 U.S.C. 154(b) by 218 days.

(21) Appl. No.: 11/884,685

(22) PCT Filed: Mar. 2, 2006

(86) PCT No.: PCT/JP2006/303954

§ 371 (c)(1),
(2), (4) Date: Aug. 20, 2007

(87) PCT Pub. No.: WO2006/098158

PCT Pub. Date: Sep. 21, 2006

(65) Prior Publication Data

US 2009/0120715 A1 May 14, 2009

(30) Foreign Application Priority Data

Mar. 17, 2005 (JP) ............................ 2005-077260

(51) Int. Cl.
*H05K 5/00* (2006.01)

(52) U.S. Cl. ....................... 181/151; 181/148; 381/345; 381/354

(58) Field of Classification Search ................. 181/151, 181/148
See application file for complete search history.

(56) References Cited

U.S. PATENT DOCUMENTS 4,450,929 A * 5/1984 Marrs ......................... 181/146
4,657,108 A 4/1987 Ward
4,677,019 A * 6/1987 von Blucher ................ 442/227
7,448,467 B2 * 11/2008 Wright et al. ............... 181/149
7,463,747 B2 * 12/2008 Kuze et al. .................. 381/345
7,477,755 B2 * 1/2009 Saiki et al. .................. 381/349
7,504,033 B2 * 3/2009 Takagi et al. ................ 210/295
2001/0030078 A1 * 10/2001 Jones et al. ................. 181/150
2004/0251077 A1 12/2004 Wright et al.
2005/0181841 A1 * 8/2005 Dou ........................ 455/575.1
2007/0165895 A1 7/2007 Matsumura et al.

FOREIGN PATENT DOCUMENTS

DE 197 23 338 12/1998
EP 1 696 694 8/2006
JP 60-500645 5/1985
JP 01-226296 9/1989

(Continued)

OTHER PUBLICATIONS

Microfilm of the specification and drawings annexed to the request of Japanese Utility Model Application No. 149459/1980 (Laid-open No. 72680/1982) (Kenzo Inoue), May 4, 1982, Full text; Figs. 1 to 3.

(Continued)

*Primary Examiner*—Jeffrey Donels
*Assistant Examiner*—Forrest M Phillips
(74) *Attorney, Agent, or Firm*—Wenderoth, Lind & Ponack, L.L.P.

(57) ABSTRACT

A speaker system that includes a speaker unit, a cabinet, a plurality of protruding materials, and a gas adsorbing material. The cabinet forms a chamber at a backside of the speaker unit. The plurality of protruding materials are formed inside the chamber and connected to the cabinet. The gas adsorbing material is supported, in a space, by the plurality of protruding materials. Accordingly, it is possible to easily increase a contact area between the gas adsorbing material and the space theresurrounding.

18 Claims, 14 Drawing Sheets

FOREIGN PATENT DOCUMENTS

| | | |
|---|---|---|
| JP | 05-130690 | 5/1993 |
| JP | 2003-070085 | 3/2003 |
| JP | 2004-537938 | 12/2004 |
| WO | 03/101147 | 12/2003 |

OTHER PUBLICATIONS

Microfilm of the specification and drawings annexed to the request of Japanese Utility Model Application No. 54872/1979 (Laid-open No. 155170/1980) (Mitsubishi Electric Corp.), Nov. 8, 1980, Full text; Fig. 6.

Microfilm of the specification and drawings annexed to the request of Japanese Utility Model Application No. 21766/1980 (Laid-open No. 123688/1981) (Sony Corp.), Sep. 19, 1981, Full text; Figs. 1 to 6.

Microfilm of the specification and drawings annexed to the request of Japanese Utility Model Application No. 5014/1978 (Laid-open No. 18801/1980) (Onkyo Corp.), Feb. 6, 1980, Full text; Figs. 1 to 2.

Supplementary European Search Report dated Apr. 1, 2009 for European Application No. 06715063.1.

Wright, J. R., "The Virtual Loudspeaker Cabinet" Journal of the Audio Engineering Society, Audio Engineering Society, New York, NY, US, vol. 51, No. 4, Apr. 1, 2003, pp. 244-247, XP001177694.

* cited by examiner

SPEAKER SYSTEM

BACKGROUND OF THE INVENTION

1. Field of the Invention

The present invention relates to a speaker system utilizing an adsorption phenomenon of a gas, and equipment accommodating the same.

2. Description of the Related Art

Conventionally, it has been difficult for a small-size speaker system to reproduce a bass sound in consideration of an influence of acoustic stiffness exerted in a chamber of a speaker cabinet. This is because a reproduction limit of the bass sound of the speaker system is determined depending on a capacity of the cabinet. Thus, for the purpose of expanding the reproduction limit of the bass sound without enlarging the capacity of the cabinet, there has been a speaker system which has activated carbon located inside of the cabinet (for example, Patent Document 1).

FIG. 13 is a cross-sectional view of a main portion of the speaker system described in Patent Document 1. Further, FIG. 14 is a cross-sectional view viewed from along line K-L of FIG. 13. In FIG. 13, the speaker system includes a cabinet 101, a woofer 102, activated carbon 103, a supporting material 104, a diaphragm 105, and a vent tube 106. The woofer 102 is fixed to an opening portion of the cabinet 101. The activated carbon 103 is an aggregation of granular activated carbon. A shape of the activated carbon 103 is maintained in a predetermined shape by the supporting material 104. The supporting material 104 is formed by, for example, a netted material, and on a surface thereof, pores are formed so as to allow air to pass through. The diaphragm 105 is located between the woofer 102 and the activated carbon 103, and divides the chamber inside the cabinet 101 into two. The vent tube 106 connects the two chambers divided by the diaphragm 105.

An action of the speaker system shown in FIG. 13 will be described. When an electric signal is applied to the woofer 102, a pressure in a chamber at a side of the woofer 102 changes, and the diaphragm 105 vibrates due to the pressure. Here, with regard to a chamber at the side of the activated carbon 103, a pressure change occurs inside the chamber due to vibration of the diaphragm 105, however, since air molecules inside the chamber are adsorbed by the activated carbon 103 depending on the pressure inside the chamber, the pressure change inside the chamber is suppressed. As a result, the same effect as a case where the capacity of the cabinet 101 is enlarged can be obtained, and consequently, it is possible to reproduce the bass sound even with a small cabinet, as if with a large cabinet.

Patent Document 1: Japanese National Phase PCT Laid-Open Publication No. 60-500645

BRIEF SUMMARY OF THE INVENTION

Here, in the speaker system having a structure as above described, for the purpose of increasing an adsorption effect of the activated carbon 103, it is preferable that the activated carbon 103 has wedge-shaped air gaps as shown in FIG. 14. This is because this structure allows increase in a contact area between space in the chamber and the activated carbon 103. However, arrangement of such air gaps on the activated carbon 103 has problems as follows.

First, there is a problem in that it is difficult to maintain a whole shape of the activated carbon 103. That is, since the activated carbon 103 is of a granular type, and the supporting material 104 is a netted material, the supporting material 104 is deformed by vibration or the like, and consequently the air gaps could not be formed in an effective manner. For example, in the case where the speaker system is accommodated in a vehicle or a portable device, the air gaps are likely to be lost because the activated carbon 103 and the supporting material 104 are deformed by the vibration of the device. Further, the speaker system as shown in FIG. 13 is particularly effective for miniaturization, however, in this case, the activated carbon 103 and the supporting material 104 also need to be miniaturized, as a matter of course. However, it is substantially difficult to shape the supporting material 104 into a complicated shape as shown in FIG. 14, and there is a problem in that the conventional technique as above described is hardly applied to a small size speaker system.

Therefore, an object of the present invention is to provide a speaker system which is, without depending on a shape of the gas adsorbing material such as the activated carbon, capable of enlarging the contact area between the gas adsorbing material and the space.

To achieve the above object, the present invention has the following structure. That is, a first aspect is a speaker system. The speaker system comprises: a speaker unit; a cabinet forming a chamber at a backside of the speaker unit; a plurality of protruding materials which are formed in the chamber and connected to the cabinet; and a gas adsorbing material supported by the plurality of protruding materials in the chamber.

In a second aspect, the cabinet may be formed in an integrated manner with a frame of the speaker unit.

In a third aspect, spaces formed by the plurality of protruding materials may be connected to the chamber.

In a fourth aspect, the plurality of protruding materials may be located on at least one face of the cabinet.

In a fifth aspect, the gas adsorbing material may be clamped and fixed by the plurality of protruding materials.

In a sixth aspect, the gas adsorbing material may be formed by activated carbon.

In a seventh aspect, the activated carbon may be formed by solidifying granular activated carbon.

In an eighth aspect, the activated carbon may have holes formed so as to extend from a surface facing the speaker unit toward a direction far away from the speaker unit.

In a ninth aspect, the activated carbon may be formed by fibrous activated carbon.

In a tenth aspect, the speaker unit may be any one of an electro-dynamic speaker, a piezoelectric speaker, an electrostatic speaker, or an electromagnetic speaker.

In an eleventh aspect, the speaker unit may include: a diaphragm located so as to form the chamber within the cabinet; and an actuator which is located in the chamber and causes the diaphragm to vibrate.

In a twelfth aspect, the speaker system may further comprise a divider which is located in the chamber and has a plurality of sound holes. In this case, the gas adsorbing material is supported by the plurality of protruding materials and the divider.

In a thirteenth aspect is a portable terminal device, comprising: a speaker system; and an equipment housing for retaining the speaker system therein. The speaker system includes: a speaker unit for generating a sound; a cabinet forming a chamber at a backside of the speaker unit; a plurality of protruding materials which are formed in the chamber and connected to the cabinet; and a gas adsorbing material supported by the plurality of protruding materials in the chamber.

In a fourteenth aspect, the cabinet has pores formed so as to connect the chamber to an inside of the equipment housing.

Further, a fifteenth aspect is audio-visual equipment, comprising: a speaker system; a display device; and an equipment housing for retaining the speaker system therein so as to allocate the speaker system around the display device. The speaker system includes: a speaker unit for generating a sound; a cabinet forming a chamber at a backside of the speaker unit; a plurality of protruding materials which are formed in the chamber and connected to the cabinet; and a gas adsorbing material supported by the plurality of protruding materials in the chamber.

In a sixteenth aspect, the cabinet may have pores formed so as to connect the chamber to an inside of the equipment housing.

In a seventeenth aspect is a vehicle, comprising: a speaker system; and a retaining section for retaining the speaker so as to emit a sound generated by the speaker system into an inside of the vehicle. The speaker system includes: a speaker unit for generating a sound; a cabinet forming a chamber at a backside of the speaker unit; a plurality of protruding materials which are formed in the chamber and connected to the cabinet; and a gas adsorbing material supported by the plurality of protruding materials in the chamber.

In an eighteenth aspect, the retaining section may be of a shape having a space in an inside thereof, and retains the speaker system in the inside. In this case, the cabinet has pores formed so as to connect the chamber to the space in the inside of the retaining section.

According to the speaker system of the present invention, the chamber at the backside of the speaker unit has protruding sections, whereby a space is formed between the gas adsorbing material and an inside wall face of the cabinet space such that a sound is passing through therebetween, and consequently it is possible to enlarge a contact area between the activated carbon and the space regardless of a shape of the activated carbon. Accordingly, an equivalent capacity of the chamber is increased in an efficient manner, and a reproduction bandwidth of bass can be expanded. Further, it is possible to reduce an acoustic loss caused by the sound passing through an inside of the activated carbon, whereby deterioration in the sound pressure level can be improved. Further, the protruding sections can be formed easily regardless of the shape of the chamber, therefore it is possible to easily secure a sound path even if the chamber is formed in an irregular shape, for example, in accordance with a free space of accommodating equipment. Furthermore, the protruding sections support the gas adsorbing material, whereby the gas adsorbing material can be retained in a secured manner even in a vibrational state such as a case of being in a vehicle and a cellular phone.

DETAILED DESCRIPTION OF THE INVENTION

First Embodiment

Figure 1:
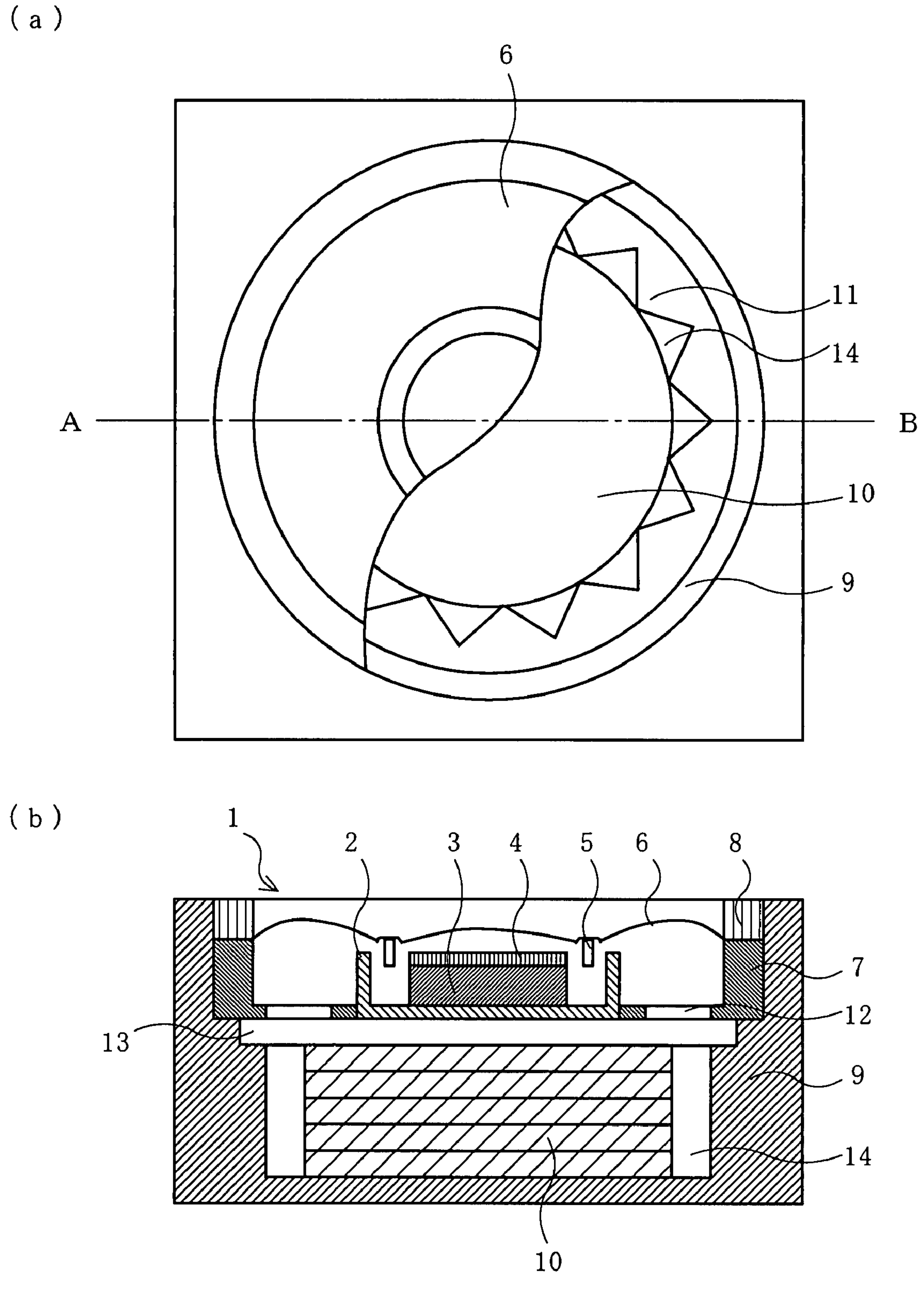
FIG. 1 is a diagram showing a speaker system according to a first embodiment of the present invention.

FIG. 1 is a diagram showing a speaker system according to a first embodiment of the present invention. FIG. 1(*a*) is a top view of a speaker system with a part of a speaker unit allocated thereon being cut off such that an internal structure can be viewed. FIG. 1(*b*) is a cross-sectional view viewed from along line A-B shown in FIG. 1(*a*). In FIG. 1, the speaker system includes a speaker unit 1, a cabinet 9, activated carbon 10, and protruding sections 11. Note that in the first embodiment, an example of an electro-dynamic speaker will be described.

The speaker unit 1 includes a yoke 2, a magnet 3, a plate 4, a voice coil 5, a diaphragm 6, a frame 7, and a gasket 8. The yoke 2 has a box shape whose bottom face is of a round shape and whose top face is open. The magnet 3 is firmly fixed on an upper side of the bottom face of the yoke 2. The plate 4 is fixed on an upper side of the magnet 3. Here, each of the magnet 3 and the plate 4 is of a cylindrical shape whose bottom face is of a round shape. On the other hand, the frame 7 has a box shape whose bottom face is of a round shape and whose top face is open. At a center of the bottom face of the frame 7, a mounting hole, which is the same in size as the bottom face of the yoke 2, is formed, and the yoke 2 is inserted and firmly fixed to the mounting hole. The gasket 8 is firmly fixed to an outer circumference of the top face of the frame 7. The diaphragm 6 is firmly fixed between the frame 7 and the gasket 8. The voice coil 5 is firmly fixed to the diaphragm 6 so as to be located within a magnetic gap formed between the yoke 2 and the plate 4. Further, there is a plurality of sound holes 12 formed on the bottom face of the frame 7. An overall shape of the speaker unit 1 is a cylindrical shape.

Further, the cabinet 9 has a box shape whose bottom face is of a round shape and whose top face is open. The speaker unit 1 has an outer circumference surface fixed on an inner circumference surface of the cabinet 9 so as to cover an opening portion of the cabinet 9. A depth of the cabinet 9 is greater than a height of the speaker unit 1, and thus a chamber 13 is formed in an inside of the cabinet 9 and at a lower side of the speaker unit 1. The chamber 13 is connected to an internal space of the speaker unit 1 via the sound holes 12. Further, the activated carbon 10 is located in the chamber 13. In FIG. 1, the activated carbon 10 is formed in the cylindrical shape. Note that in the first embodiment, the activated carbon 10 is formed by a lamination of a plurality of sheets of activated carbon of a fibrous type (including a felt type) (fibrous activated carbon). In another embodiment, the activated carbon 10 may be formed by one sheet of fibrous activated carbon. A plurality of the protruding sections 11 is formed on an inner circumference surface at a lower side of the cabinet 9. The activated carbon 10 is clamped and retained by the protruding sections 11. Since the activated carbon 10 is retained by the plurality of the protruding sections 11, a chamber 14 is formed on a side face of the activated carbon 10. In the first embodiment, each of the protruding sections 11 is of a triangle shape, but a shape of each of the protruding sections 11 may be of any shape as long as the chamber 14 can be formed on the side face of the activated carbon 10.

An action of the speaker system configured as above will be described. The yoke 2, the magnet 3, the plate 4, and the voice coil 5, all composing a magnetic circuit, act as a driving force generation means, and when an acoustic signal is applied to the voice coil 5, a driving force will be generated in the voice coil 5. As a result, the diaphragm 6 firmly fixed on the voice coil 5 vibrates, whereby a sound is emitted from the diaphragm 6. Since an action of the speaker unit 1, which is an electro-dynamic speaker, is well known, a detailed description will be omitted here.

The sound generated at a backside of the diaphragm 6 is transferred to the chamber 13 through the sound holes 12. In this case, an pressure of the chamber 13 changes due to the sound, but since the activated carbon 10 is located in an inside of the chamber 13, a change in the pressure in the chamber 13 is suppressed because of an adsorption of a gas by the activated carbon 10. Accordingly, the same effect as a case where a capacity of the cabinet 9 is enlarged can be obtained, whereby a reproduction limit of a bass sound can be expanded.

Here, a case will be considered, where the protruding sections 11 are not formed on the inner circumference surface of the cabinet 9, and whole of the inner circumference surface of the cabinet and an outer circumference surface of the activated carbon 10 contact with each other, thereby retaining the activated carbon 10. In this case, only a top face of the activated carbon 10 contacts with the chamber 13. Therefore, the sound generated at the backside of the diaphragm 6 transfers from the chamber 13 to the lower side part of the activated carbon 10 after passing through the top face of the activated carbon 10. In this case, since the sound transfers passing through an inside of the activated carbon 10, the sound pressure will deteriorate due to a sound damping effect by the activated carbon, compared to a case where a sound transfers through the air. Therefore, in the case where the protruding sections 11 are not formed in the cabinet 9, a sound pressure level of a sound to be reproduced is likely to be deteriorated.

On the other hand, in the first embodiment, the protruding sections 11 are placed in the cabinet 9, whereby the chamber 14 connected to the chamber 13 is formed on the sides of the activated carbon 10. In this case, the top face and the side face of the activated carbon 10 contact with spaces (the chamber 13 and the chamber 14). Therefore, the sound generated at the backside of the diaphragm 6 transfers from the chamber 13 to the lower side part of the activated carbon 10 after passing through the top face of the activated carbon 10, and also transfers from the chamber 13 to the lower side part of the activated carbon 10 after passing through the chamber 14 at the sides of the activated carbon 10. With regard to the sound which transfers passing through the chamber 14, an acoustic loss is smaller compared to a case of passing through the inside of the activated carbon 10, and thus, with the chamber 14, it is possible to reduce the acoustic loss in the inside of the activated carbon 10. As above described, according to the first embodiment, it is possible to suppress deterioration in the sound pressure level compared to the case where the protruding sections 11 are not formed in the inner circumference surface of the cabinet 9.

Note that, in the first embodiment, the fibrous activated carbon is used as the activated carbon 10, however, the activated carbon to be used may be of a granular type (a powdery type), or may be of a block shape of the granular type solidified with a binder such as a resin. The fibrous activated carbon has micro pores, which adsorb the gas and are located at a position much closer to a contact surface with the outside, compared to the granular activated carbon or the like, and thus is considered to have an increased effect of enlarging the reproduction limit of the bass sound. Further, in the case of using the granular activated carbon, a retaining material is needed such that an aggregation of the granular activated carbon can be retained in a fixed shape to some extent. That is, instead of the activated carbon 10, the granular activated carbon and the retaining material for retaining the granular activated carbon therein may be used. The retaining material represents, for example, a bag which retains the granular activated carbon in an inside thereof. The sound generated by the speaker unit 1 is transferred through the bag to the inside of the bag, the bag may seal the activated carbon in the inside thereof. Note that in the case of using the granular activated carbon and the retaining material, it is likely that the retaining material will be deformed by vibration or the like, but the chamber 14 can be maintained by increasing a height of the protruding sections 11 even if the retaining material is deformed.

Figure 2:
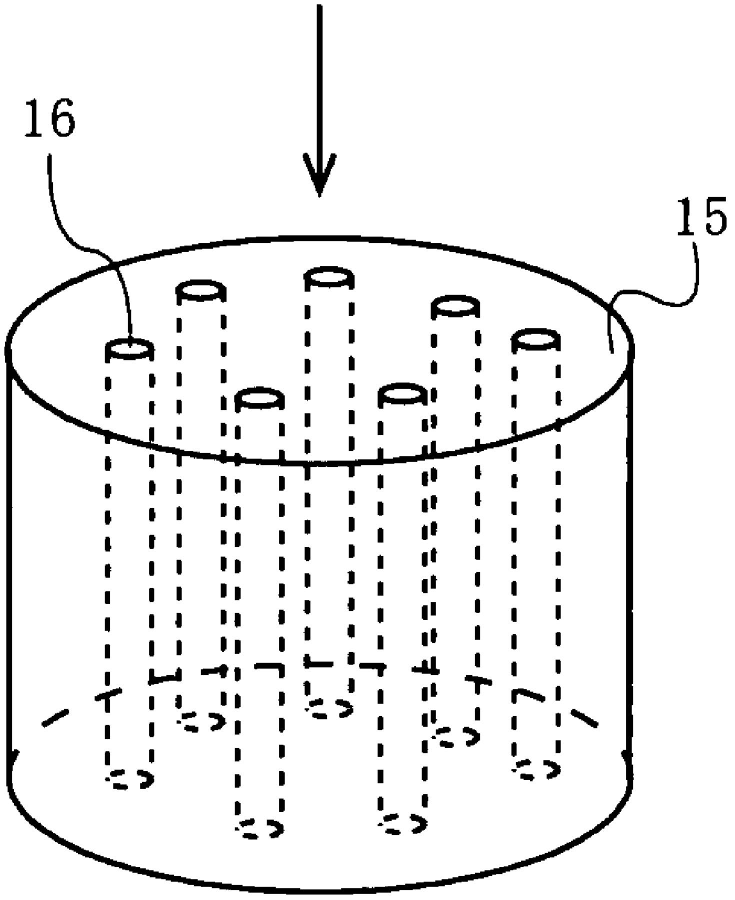
FIG. 2 is a diagram showing activated carbon used in another embodiment.

Note that in the case of using the block shaped activated carbon which is made by solidifying the granular activated carbon, holes may be formed in the activated carbon as shown in FIG. 2. FIG. 2 is a diagram showing the activated carbon used in another embodiment. As shown in FIG. 2, a plurality of holes 16 is formed in the block shaped activated carbon 15. Each of the holes 16 is formed in a tube shape to as to face approximately the same direction as each other. The activated carbon 15 is preferably located in the inside of the cabinet 9 such that a traveling direction of the sound generated by the speaker unit 1 (see an arrow as shown in FIG. 2) and the direction of the holes 16 coincide with each other. In other words, it is preferable that the speaker unit 1 is located at a position opposed to a surface of the activated carbon 15 on which the hole 16 are formed. In this case, the hole 16 are formed in a manner extending from the surface opposed to the speaker unit 1 to a direction away from the speaker unit 1. Specifically, with reference to FIG. 1 as an example, the activated carbon 15 is located such that the top face of the activated carbon 15 as shown in FIG. 2 is opposed to the direction of the speaker unit 1, and the under face of the activated carbon 15 contacts with the bottom face of the cabinet 9. The direction of the activated carbon 15 to be located is determined by a positional relation with the speaker unit 1, and for example, in the case of a speaker system according to a second embodiment described below (see FIG. 4), it is preferable that the activated carbon is located such that the holes will be in a traverse direction (a direction approximately parallel with the diaphragm 34). Accordingly, the sound generated in the speaker unit 1 transfers to a part of the activated carbon 15 far from the speaker unit 1 without being interrupted by the activated carbon 15. Therefore, the effect of the adsorption of the gas can be obtained sufficiently in the activated carbon 15 not only at a part close to the speaker unit 1 but also at the part far therefrom. Accordingly, an effect of expanding the reproduction limit of the bass sound can be increased compared to a case where holes are not formed.

Further, in the case of using the above-described block shaped activated carbon, the activated carbon may be located in the cabinet such that protruding sections are formed in the activated carbon, and the protruding sections contact with the cabinet. That is, a material for the protruding section for supporting the activated carbon may be formed by the activated carbon itself. Even with this structure, it is possible to form a chamber between the activated carbon and the cabinet, and thus the same effect as the above-described first embodiment can be obtained.

As above described, according to the first embodiment, it is possible to increase the contact area between the activated carbon and the surrounding space without shaping the activated carbon 10 into a complex shape, for example, by creating the air gaps. Accordingly, it is possible to utilize the effect of the adsorption of the activated carbon in an efficient manner, and also to suppress the deterioration in the sound pressure level. Further, since the activated carbon is not necessarily shaped into the complex shape, even a small-size speaker system can be produced in a simple manner.

Second Embodiment

Figure 3:
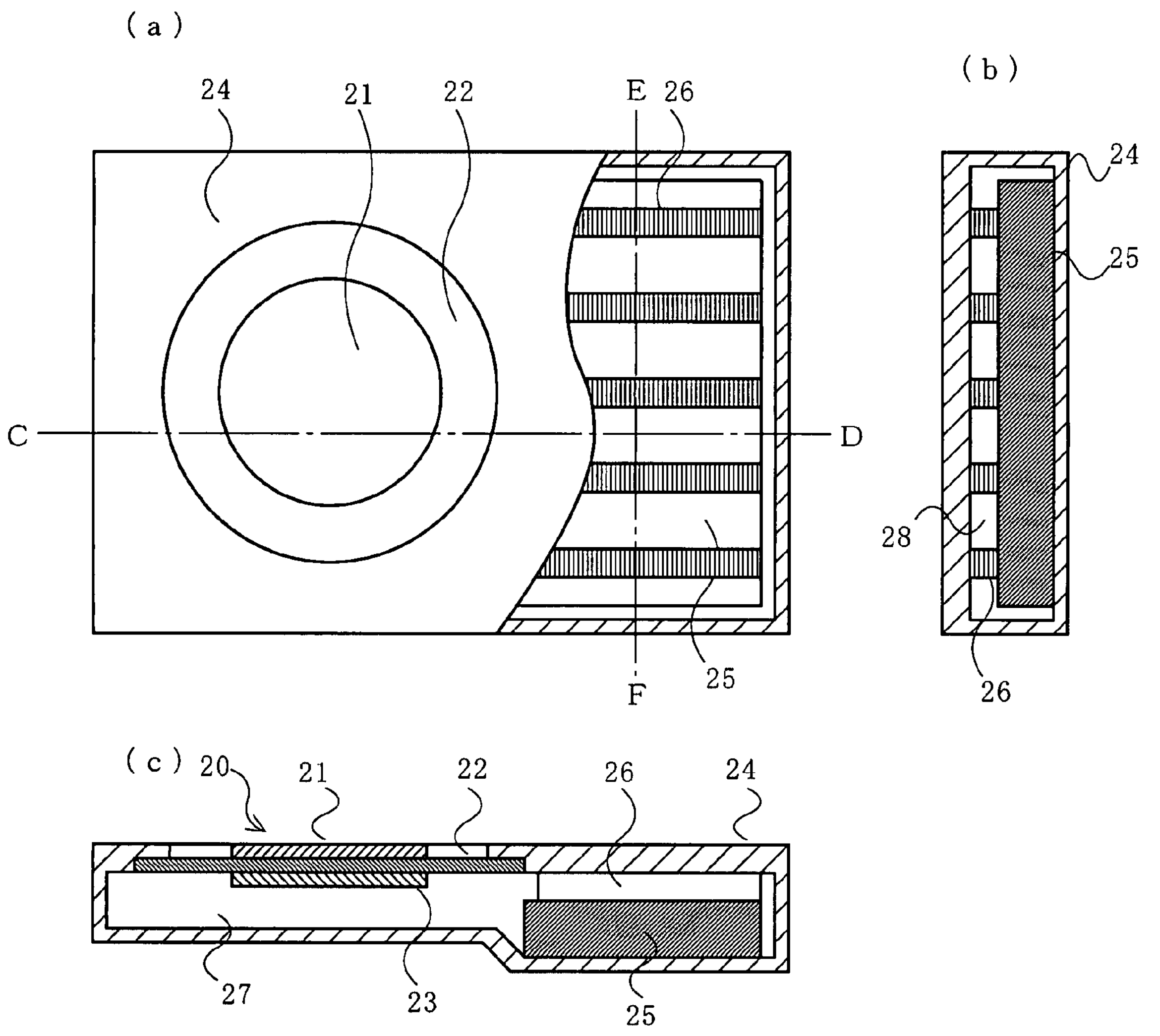
FIG. 3 is a diagram showing a speaker system according to a second embodiment of the present invention.

FIG. 3 is a diagram showing a speaker system according to a second embodiment of the present invention. FIG. 3(*a*) is a top view of the speaker system with a part of a speaker unit located thereon being cut off such that an internal structure can be viewed. FIG. 3(*b*) is a cross-sectional view viewed from along line C-D shown in FIG. 3(*a*), and FIG. 3(*c*) is a cross-sectional view viewed from along line E-F of FIG. 1(*a*). In FIG. 3, the speaker system includes a speaker unit 20, a frame 24, activated carbon 25, and protruding sections 26. In the second embodiment, a piezoelectric speaker will be described as an example.

The speaker unit 20 is the piezoelectric speaker, and includes a piezoelectric elements 21 and 23, and an intermediate electrode 22. The frame 24 has a chamber 27 in an inside thereof, and a hole is formed on a part of a top face thereof. The intermediate electrode 22 is fixed on the frame 24 such that an outer circumference thereof blocks the hole. The piezoelectric element 21 is attached to one face of the intermediate electrode 22, and the piezoelectric element 23 is attached to another face of the intermediate electrode 22. On the other hand, the activated carbon 25 is located in the chamber 27 which is in the inside of the frame 24. The activated carbon 25 is located at an outer side of a space directly below the speaker unit 20. In the second embodiment, the activated carbon 25 is of a plate-like shape in which areas of a top face and a under face thereof are larger than those of the remaining faces. A plurality of the protruding sections 26 is located in a space directly above the activated carbon 25, and each of the plurality of the protruding sections 26 is fixed on an inner side of the top face of the frame 24. The activated carbon 25 is clamped and supported by the protruding sections 26 and a bottom face of the frame 24. Further, each of the plurality of the protruding sections 26 is of an elongated rectangular parallelepiped, and spaces 28 are formed between the each of the plurality of the protruding sections 26. Therefore, the spaces 28 are formed between the top face of the activated carbon 25 and the inner side of the top face of the frame 24. Further, in FIG. 3, a thickness of a part of the frame 24, where the activated carbon 25 is located, is thicker than a thickness of apart where the activated carbon 25 is not located.

An action of the speaker system configured as above will be described. In the speaker unit 20 of a piezoelectric type, when an electric voltage is applied to the piezoelectric elements 21 and 23 attached to the both faces of the intermediate electrode 22, the intermediate electrode 22 vibrates due to extraction and contraction or bending of the piezoelectric elements 21 and 23, whereby a sound is generated. Since an action of the speaker unit 20, which is the piezoelectric speaker, is well known, a detail description thereof will be omitted here.

The sound generated at a backside of the speaker unit 20 is emitted to the chamber 27 of the frame 24. In this case, a pressure in the chamber 13 changes do to the sound, but since the activated carbon 25 is located in the inside of the chamber 27, a pressure change in the inside of the chamber 27 is suppressed due to adsorption of a gas by the activated carbon 25. Therefore, the same effect as a case where a capacity of an internal space of the frame is expanded can be obtained, whereby a reproduction limit of a bass sound can be increased.

Further, a plurality of the spaces 28 is allocated by the protruding sections 26 between the top face of the activated carbon 25 and the inner side of the top face of the frame 24, and thus the sound emitted from the backside of the speaker unit 20 transfers from the wide top face of the activated carbon 25 to an inside thereof after passing through the spaces 28. Therefore, in the second embodiment, as with the first embodiment, it is possible to reduce an acoustic loss caused by the sound transferring through the inside of the activated carbon 25, thereby improving a reproduction sound pressure of the speaker system.

Figure 4:
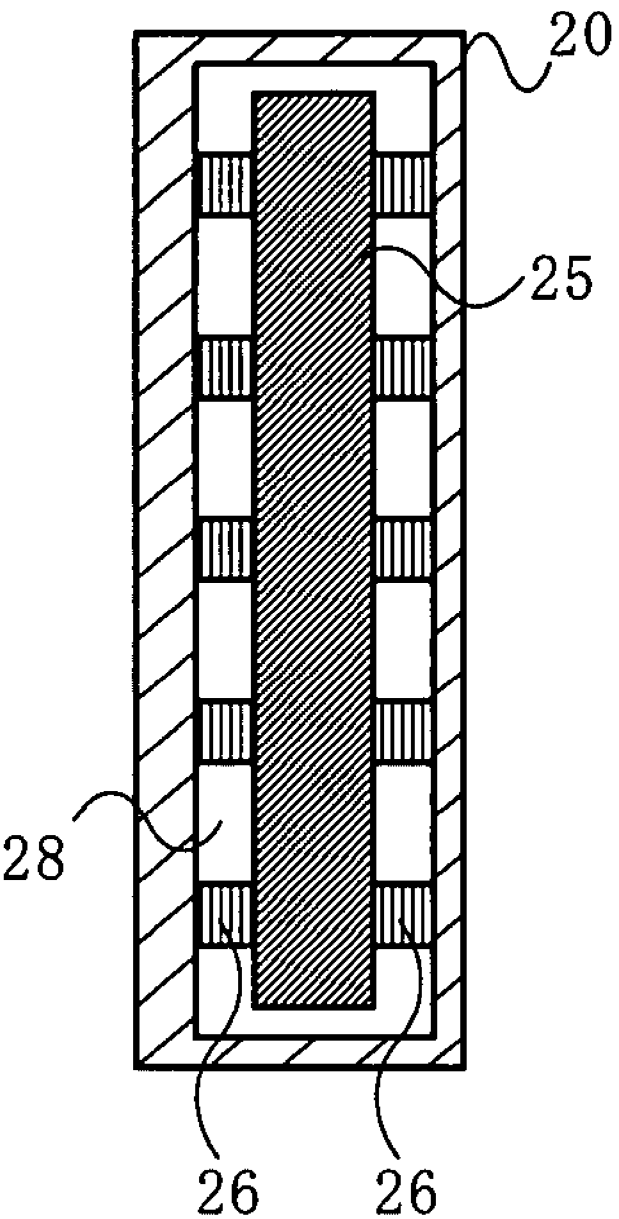
FIG. 4 is a diagram showing a speaker system according to an alternative example of the second embodiment.

Note that, in the second embodiment, only the top face side of the activated carbon 25 is supported by the protruding sections 26, but, other faces may be supported by the protruding sections. FIG. 4 is a diagram showing a speaker system according to an alternative example of the second embodiment. Note that FIG. 4 is a cross-sectional view of the speaker system viewed from the same direction as the FIG. 3(*b*), and such components parts that are the same as FIG. 3 are provided common reference characters.

In FIG. 4, the protruding sections 26 are fixed to an inner side of the under face of the frame 24 in addition to the inner side of the top face thereof. Therefore the activated carbon is supported by the protruding sections 26 from the both sides of the top face and the under face. Accordingly, since the spaces 28 are formed on the both sides of the activated carbon 25, a contact area between the activated carbon 25 and an outside space increases to approximately twice, whereby further reduction in the acoustic loss in the activated carbon can be expected.

Third Embodiment

Figure 5:
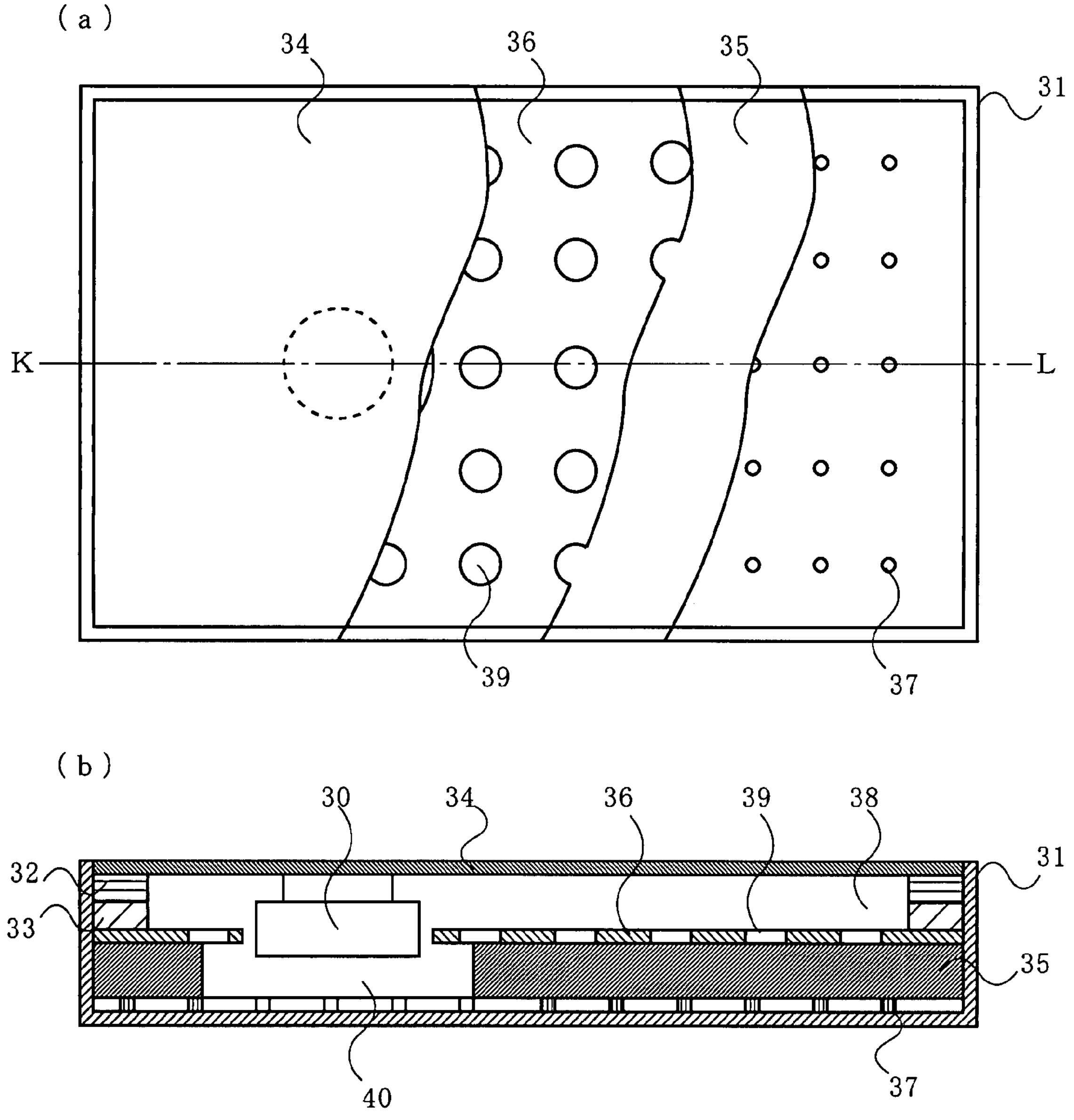
FIG. 5 is a diagram showing a speaker system according to a third embodiment of the present invention.

FIG. 5 is a diagram showing a speaker system according to a third embodiment of the present invention. FIG. 5(*a*) is a top view of the speaker system with a part of a top face of the speaker system being cut off such that an internal structure can be viewed. FIG. 5(*b*) is a cross-sectional view viewed from along line K-L shown in FIG. 5(*a*). In FIG. 5, The speaker system includes an actuator 30, a cabinet 31, a suspension 32, an internal rim 33, a diaphragm 34, activated carbon 35, dividers 36, and protruding sections 37. In the third embodiment, speaker unit for generating a sound includes the actuator 30 and the diaphragm 34.

The cabinet 31 is of a box shape whose top face is open. An outer circumference of the internal rim 33 is of a ring shape and coincides with an inner circumference of the cabinet 31, and the outer circumference surface is fixed to the inner circumference surface of the cabinet 31. The suspension 32 is fixed on the top face of the internal rim 33. The diaphragm 34 is fixed on the top face of the suspension 32. The diaphragm 34 is the same in size as an opening portion of the cabinet 31, and is located so as to cover the opening portion. On the other hand, the divider 36 is the same in size as the opening portion of the cabinet 31, and is fixed to an under face of the internal rim 33 and the inner circumference surface of the cabinet 31. In the divider 36, a mounting hole is formed, which is larger than a plurality of sound holes 39 and outer circumference of the actuator 30. Further, a top face of the actuator 30 and an under face of the diaphragm 34 is fixed to each other.

Further, on an inner side of a bottom face of the cabinet 31, a plurality of cylindrical protruding sections 37 are formed. The activated carbon 35 is clamped by the protruding sections 37 at the under face thereof and the divider 36 at the top face thereof. In FIG. 5, the activated carbon 35 is of a rectangular parallelepiped having a hole larger than a bottom face of the actuator 30, and located such that the actuator 30 is situated at a position of the hole. As above described, the top face of the activated carbon 35 contacts with the chamber 38 which is at an upper side of the divider 36 via the sound holes 39, and a side face and the under face thereof contact with the chamber 40 which is at an lower side of the divider 36.

An action of the speaker system configured as above will be described. In the third embodiment, a sound is generated by the actuator 30 and the diaphragm 34 connected thereto. That is, when an acoustic signal is applied to the actuator 30, the actuator 30 transfers a vibration depending on the acoustic signal to the diaphragm 34. The diaphragm 34 generates the sound based on the transferred vibration.

A sound generated at a backside of the diaphragm 34 or a sound generated directly form the actuator 30 is emitted to the chambers 38 and 40. In this case, pressures of the chambers 38 and 40 change due to the sound, but since the activated carbon 35 is located in the cavities 38 and 40, pressure changes in the chambers 38 and 40 will be suppressed due to adsorption of a gas by the activated carbon 35. Therefore, the same effect as a case where a capacity of an internal space of the cabinet 31 is expanded can be obtained, whereby a reproduction limit of a bass sound can be increased.

At the top face of the activated carbon 35, the chamber 38 is allocated, and at the under face, the chamber 40 is allocated, and thus the sound generated at the backside of the diaphragm 34 or the sound generated directly from the actuator 30 transfers to the activated carbon 35 after passing through the chambers 38 and 40. Therefore, in the third embodiment, as with the first embodiment, it is possible to reduce an acoustic loss caused by the sound transferring through the inside of the activated carbon 35, thereby improving a reproduction sound pressure of the speaker system.

Further, in the third embodiment, the diaphragm 34 represents a whole of the top face of the speaker system, and thus the activated carbon 35 is supported from an upper side by placing the divider 36 in the inside of the cabinet 31. Accordingly, the activated carbon 35 contacts with the diaphragm 34, and prevents a motion of the diaphragm 34, whereby it is possible to prevent generation of a distortion noise. Further, The sound holes 39 are formed in the divider 36, whereby a contact area between the activated carbon 35 and a space is increased.

Note that the speaker system according to the third embodiment can be applied to, for example, a board speaker having a poster attached to a whole surface of the diaphragm 34, a 5.1 channel surround speaker of a wall-hung type which takes advantage of flatness, or the like.

Fourth Embodiment

Figure 6:
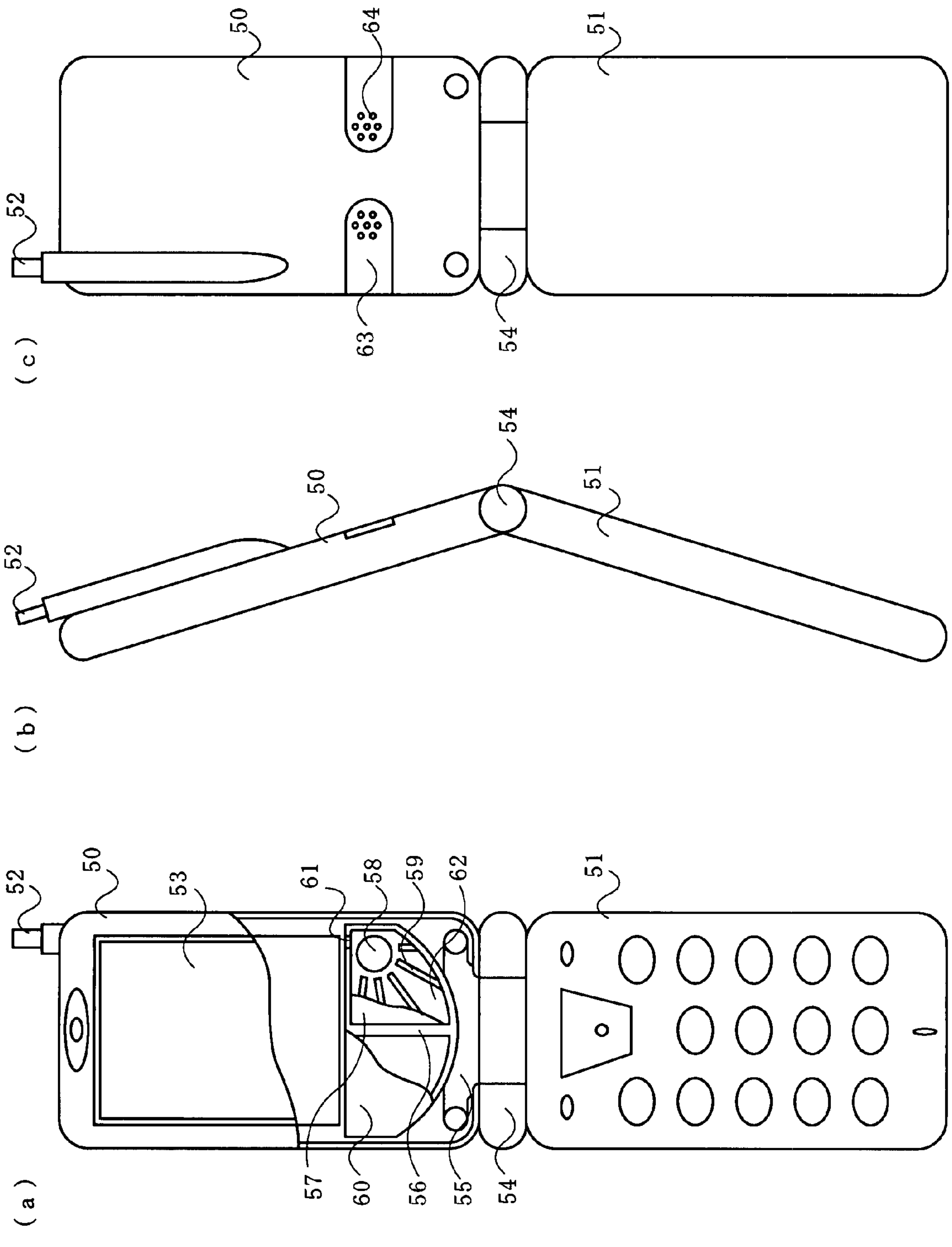
FIG. 6 is a diagram showing a cellular phone which is an example of a portable terminal device according to a fourth embodiment.

Hereinafter, an example of a case where a speaker system according to the present invention is mounted on equipment will be described. First, in a fourth embodiment, an example of a speaker system mounted on a portable terminal device will be described. FIG. 6 is a diagram showing a cellular phone which is an example of a portable terminal device according to the fourth embodiment. Here, FIG. 6(*a*) is a front view of the cellular phone a part of which is cut off so as to show an internal structure clearly, FIG. 6(*b*) is a side view of the cellular phone, and FIG. 6(*c*) is a rear view of the cellular phone.

In FIG. 6, the cellular phone includes an upper case 50, a lower case 51, an antenna 52, a liquid-crystal display 53, a hinge section 54, a fixing section 55, a divider 56, activated carbon 57, speaker units 58, protruding sections 59, and a cabinet 60. The cellular phone as shown in FIG. 6 is a flip phone whose main body is composed of the upper case 50 and the lower case 51. The upper case 50 and the lower case 51 are connected to each other with the hinge section 54 so as to rotate on the hinge section 54. The hinge section 54 is fixed to the upper case 50 with the fixing section 55. In the upper case 50, the antenna 52 is fixed to an upper part thereof, and the liquid-crystal display 53 is located on an upper side of the front face thereof. The speaker system (the activated carbon 57, the speaker units 58, the protruding sections 59, and the cabinet 60) is located in an inside of the upper case 50 and at a lower side of the liquid-crystal display 53. Hereinafter, the speaker system incorporated in the cellular phone will be described.

Figure 7:
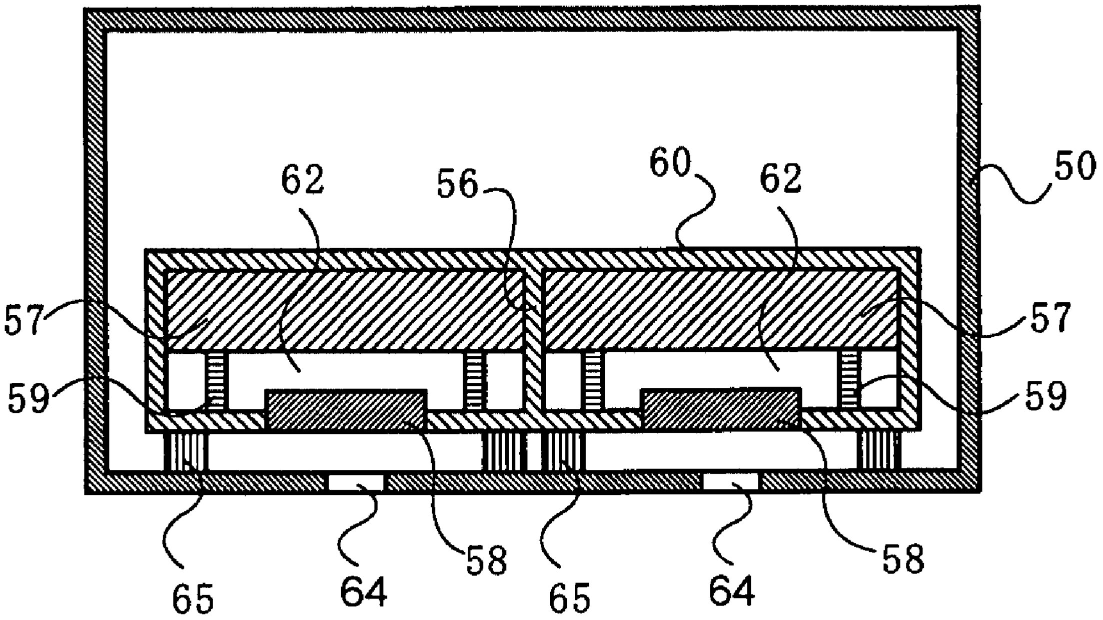
FIG. 7 is a diagram illustrating an internal configuration of a speaker system incorporated in the cellular phone shown in FIG. 6.

FIG. 7 is a diagram illustrating an internal configuration of the speaker system incorporated in the cellular phone shown in FIG. 6. Note that, FIG. 7 shows that elongated rectangular parallelepiped protruding sections 59 are located in parallel with each other for the purpose of clearly showing the internal configuration of the speaker system, however, the protruding sections 59 are actually located in a radial manner as shown in FIG. 6. Further, in FIG. 7, dents 63 on the upper case 50 are omitted.

In FIG. 6 and FIG. 7, the cabinet 60 is of a configuration having a space in an inside thereof and is located between the liquid-crystal display 53 and the fixing section 55. The cabinet 60 is fixed to the upper case 50 with a supporting section 65. The divider 56 divides a space inside the cabinet 60 into two so as to form two chambers. In the cabinet 60, two speaker units 58 are fixed in response to the respective two chambers. Accordingly, chambers 62 are formed at a backside side (an upper side in FIG. 7) of the speaker units 58. A plurality of the protruding sections 59 are fixed to the under face of the cabinet 60 so as to be located in a radial manner, respectively. The activated carbon 57 is clamped between the respective protruding sections 59 and a top face of the cabinet 60. On each of the dents 63 at a backside side of the upper case 50, sound holes 64 are formed. The sound holes 64 are located on a position opposed to the speaker units 58. Further, as shown in FIG. 6, a pore 61 is formed in the cabinet 60. The pore 61 is a very small through-hole having a diameter of about $\phi$0.5 mm.

An action of the cellular phone configured as above will be described. When a signal is received from the antenna 52, an electric signal processed at a signal processing section, which is not shown in the drawings, is inputted to the speaker units 58 on the right and left, and a melody sound representing a receiving call, for example, is reproduced from the sound holes 64. Further, as with the second embodiment, between an under face of the activated carbon 57 and an inner side of the under face of the cabinet 60, the chambers 62 are allocated by the protruding sections 59. Therefore, in the fourth embodiment as well, as with the second embodiment, it is possible to reduce an acoustic loss caused by the sound transferring through the inside of the activated carbon 57, thereby improving a reproduction sound pressure of the speaker system.

Here, the cabinet 60 is located at a free space between the liquid-crystal display 53 on the upper case 50 and the fixing section 55, whereby a maximum capacity for the cabinet 60 is secured. A shape of the cabinet 60 is not of a common rectangular parallelepiped, but of a different shape (see FIG. 6), however, the protruding sections 59 are located in the cabinet 60, whereby it is possible to easily secure an airway (the chambers 62) between the activated carbon 35 of a different shape and the cabinet 60. Further, it is not necessary to process the activated carbon 57 finely so as to increase a contact area between the activated carbon and the space, and thus even a small size speaker system such as that to be mounted on a cellular phone can be manufactured easily.

Further, since the pore 61 is, as above described, a very small pore, and an acoustic impedance thereof is very high, and consequently it is very rare that a reproduced sound leaks from the pores 61 at the time of reproduction of a speaker sound. The pore 61 is formed for the purpose of preventing the diaphragm from being deformed due to an expansion pressure on the diagram of each the speaker units 58 which is caused by a temperature increase or the like and a subsequent increase in an air pressure inside of the chambers 62. For example, in the case where the cellular phone is placed in a high-temperature environment, for example on the beach in midsummer, along with the temperature increase of the cellular phone, the air pressure inside of the chambers 62 increases due to a thermal expansion of the air in the chambers 62 inside of the cabinet 60, and consequently the diaphragm is considered to be deformed, but it is possible to prevent this situation by forming the pore 61. The increase in the air pressure in the chambers 62 due to the temperature increase changes almost in a direct current manner, compared to a frequency element of the reproduced sound. Therefore, in the case where the air pressure in the chambers 62 changes and increases along with the temperature increase, the pore 61 will not function as the acoustic impedance, but the air pressure caused by the expansion is discharged from the pore 61. Note that when the activated carbon 57 adsorbs moisture, unnecessary gas, cigarette smoke, or the like from the outside of the cellular phone via the pore 61, performance thereof will deteriorate. Therefore, it is preferable that a port of the pore 61 is formed inside of a main body of the cellular phone such that the chambers 62 do not directly contact with outside air. Further, in the case where the activated carbon 57 is of a fibrous type, for example, it is likely that fine strips of the fibrous activated carbon are discharged to an inside of the cellular phone through the pore 61. These strips of the fibrous activated carbon are composed of carbon, and thus are likely to cause a short circuit at the time of an attachment thereof to the circuit. In order to avoid this situation, it is preferable that the pore 61 includes a dustproof net having a mesh small enough to prevent the strips of the activated carbon from passing through. Further, if the dustproof net is made of a material resistant to moisture, it is possible to prevent outside moisture from entering into the chambers 62 through the pore 61, and the activated carbon 57 adsorbs the moisture, whereby deterioration in an effect of adsorption of a gas can be reduced.

Figure 8:
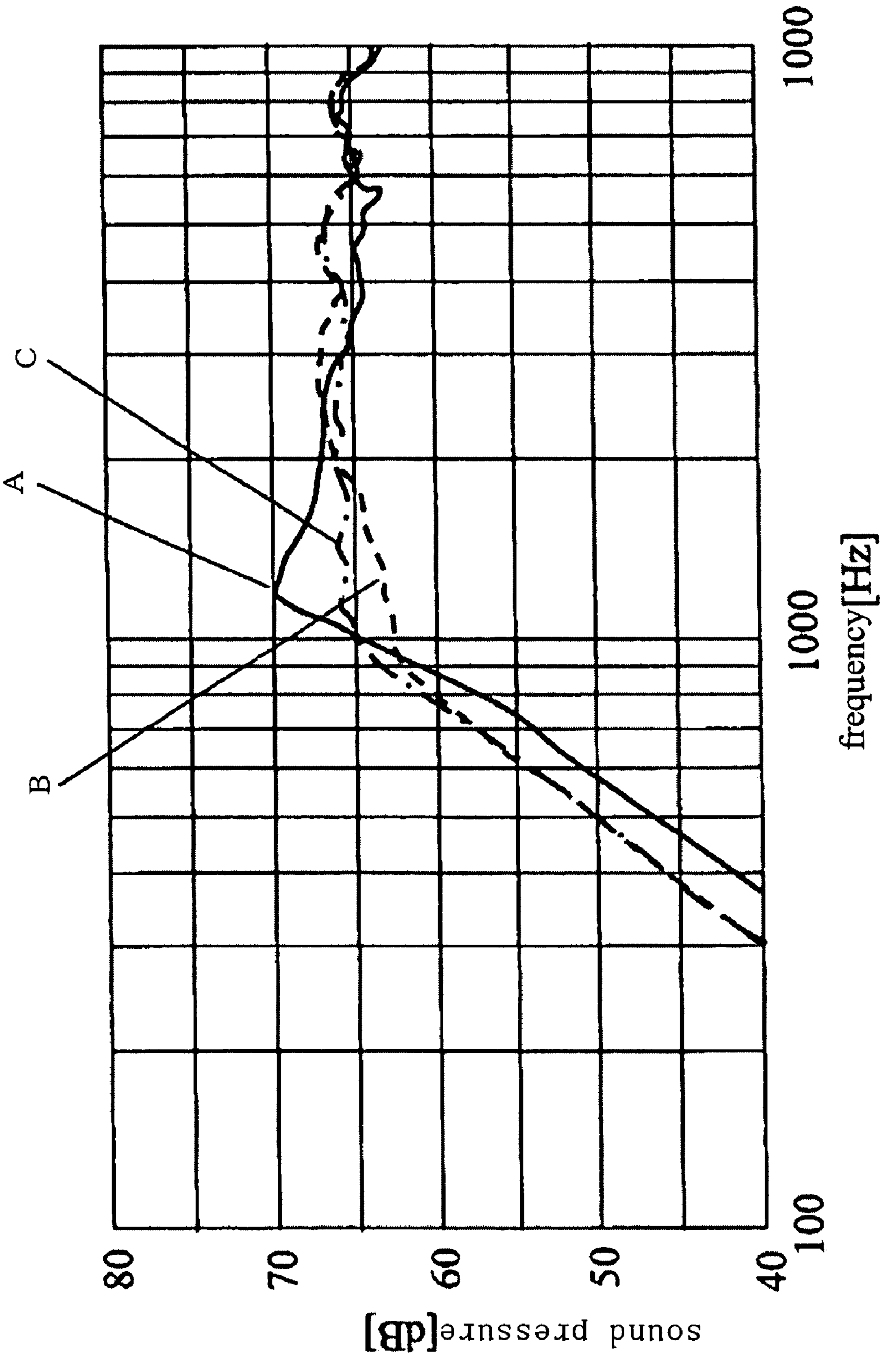
FIG. 8 is a diagram showing a sound pressure frequency response of the cellular phone according to the fourth embodiment.

FIG. 8 is a diagram showing a sound pressure frequency response of the cellular phone according to the fourth embodiment. Note that, in the sound pressure frequency response as shown in FIG. 8, the speaker unit 58 is of an electro-dynamic type having a diameter of 14 mm, a capacity of the chamber 62 is 1 cc, a height of each of the protruding sections 59 is 0.5 mm, the activated carbon 57 is fibrous activated carbon weighing 23 mg, an input power to the speaker unit is 0.2 W, and a distance between the sound holes 64 and a measuring microphone is 0.1 m. Further, in FIG. 8, curve A represents the sound pressure frequency response in the case where the activated carbon is not located, curve B represents the sound pressure frequency response in the case where the activated carbon is located in the cabinet without the protruding sections, and curve C represents the sound pressure frequency response in the case where the activated carbon is located in the cabinet with protruding sections.

As curve A of FIG. 8 shows, in the case where the activated carbon is not located in the cabinet 60 of the speaker, resonant frequency of a bass sound is high since the capacity of the cabinet 60 is as small as 1 cc, and consequently a peak of the sound pressure appears at around 1.3 kHz. Further, as curve B of FIG. 8 shows, in the case where the activated carbon is located in the cabinet without the protruding sections, the sound pressure level increases at 1 kHz or lower, and it is clear that the activated carbon is effective in expanding an equivalent capacity of the cabinet. However, in a band from 1 kHz to 2 kHz, the acoustic loss caused by the activated carbon is large, and consequently the sound pressure level deteriorates significantly, which harms flatness of the sound pressure characteristic. Compared to these, as curve C of FIG. 8 shows, in the case where the activated carbon is located in the cabinet with protruding sections, the contact area between the chamber and the activated carbon increases, and thus with respect to curve B, the sound pressure level increases by nearly 3 dB in a band from 1 kHz to 2 kHz, and it is clear that a flat sound pressure frequency response is realized in a band at 1 kHz or upper. As above described, according to the fourth embodiment, it is possible to realize a cellular phone which excels in reproducing the bass sound in spite of a compact main body.

Note that, in the fourth embodiment, the cabinet 60 is located in the upper case 50 and at a lower side of the liquid-crystal display 53, but the speaker system may be located at any position, and, may be located, for example, at an upper side or backside of the liquid-crystal display 53, in the lowercase 51, or anywhere. Further, in the fourth embodiment, the two chambers 62 in the cabinet 60 have a single shape, but may be of unsymmetrical shapes to each other. In this case, it is preferable that the chambers 62 are formed so as to have equal capacities to each other even if the shapes thereof are unsymmetrical, such that the reproduction limit of the bass sound of each of the two speaker systems becomes identical.

Further in the fourth embodiment, the pore 61 is located on one face of the cabinet 60, and if a fine canal of a tube shape is connected to the pore 61, the port of the pore 61 can be located at any position in the uppercase of the cellular phone. Therefore, with the use of the above-described fine canal, it is possible to easily locate the port of the pore 61 at a position which hardly contacts with the outside air.

Figure 9:
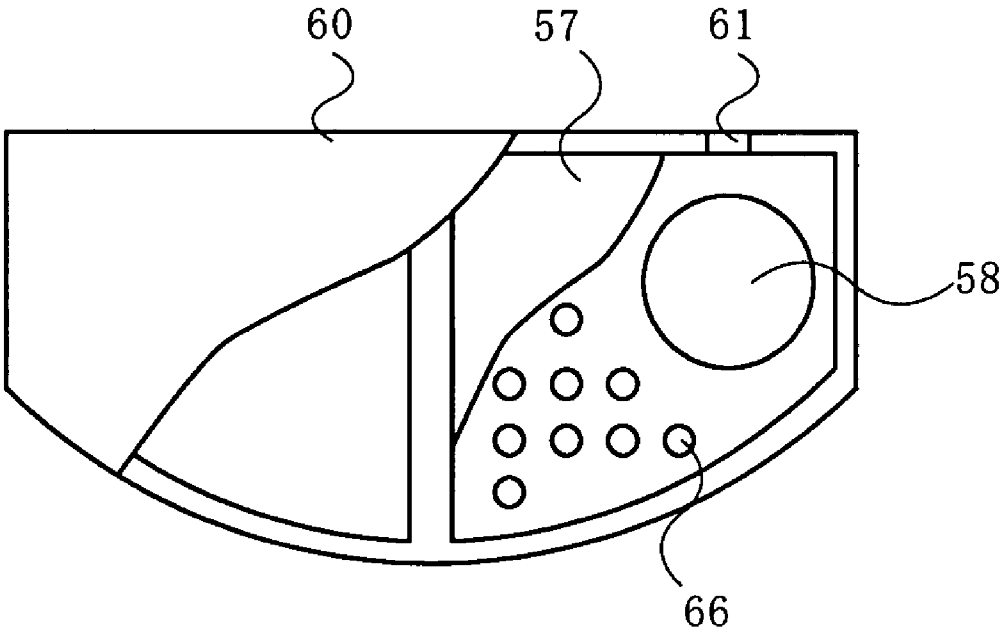
FIG. 9 is a diagram showing an alternative example of the speaker system incorporated in the cellular phone according to the fourth embodiment.

Further, in the fourth embodiment, each of the protruding sections 59 is in a shape of a square bar, and is expected to exert a similar effect even in a cylindrical shape as shown in FIG. 9. Note that the shape of the protruding sections 59 may be any shape such as a cone shape and a pyramid shape. Further, in the fourth embodiment, the protruding sections 59 are located at one side of the activated carbon 57, however, the protruding sections may be located at both sides of the activated carbon 57 such that the activated carbon 57 is clamped from the both sides by the protruding sections.

Fifth Embodiment

Figure 10:
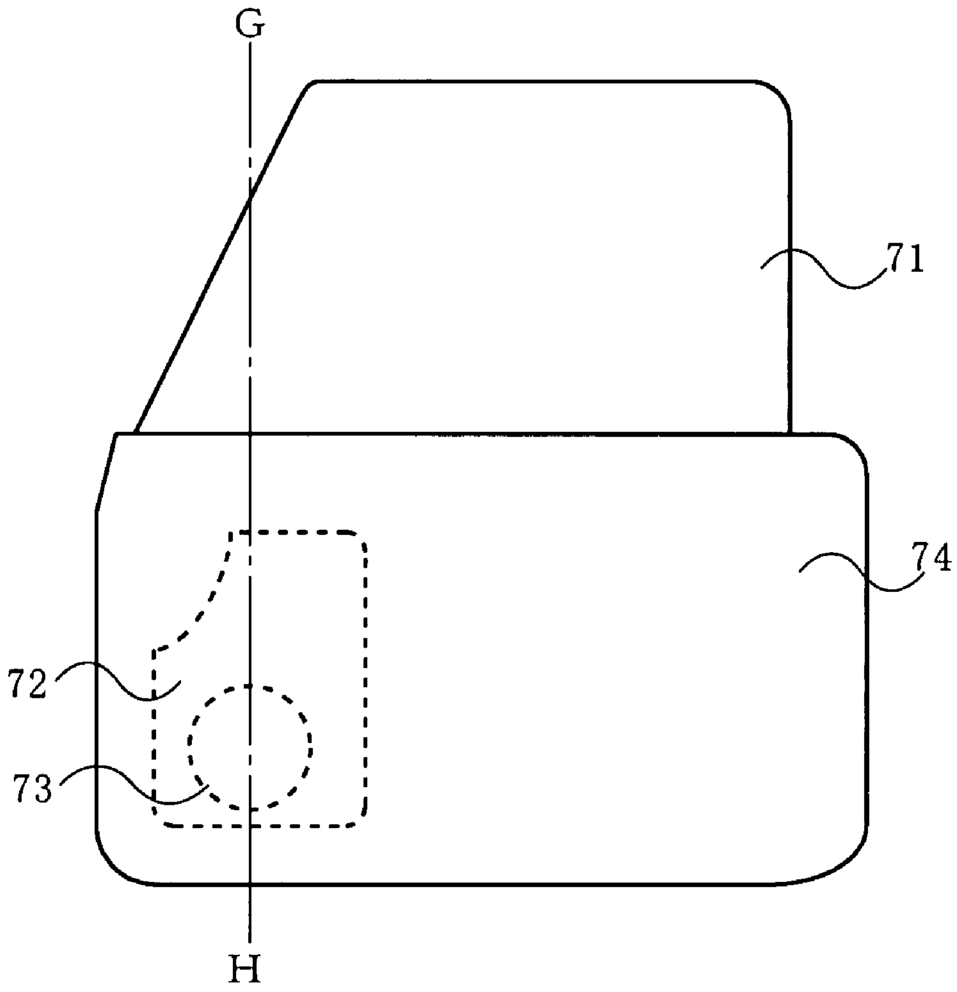
FIG. 10 is a profile of a vehicle door.
Figure 11:
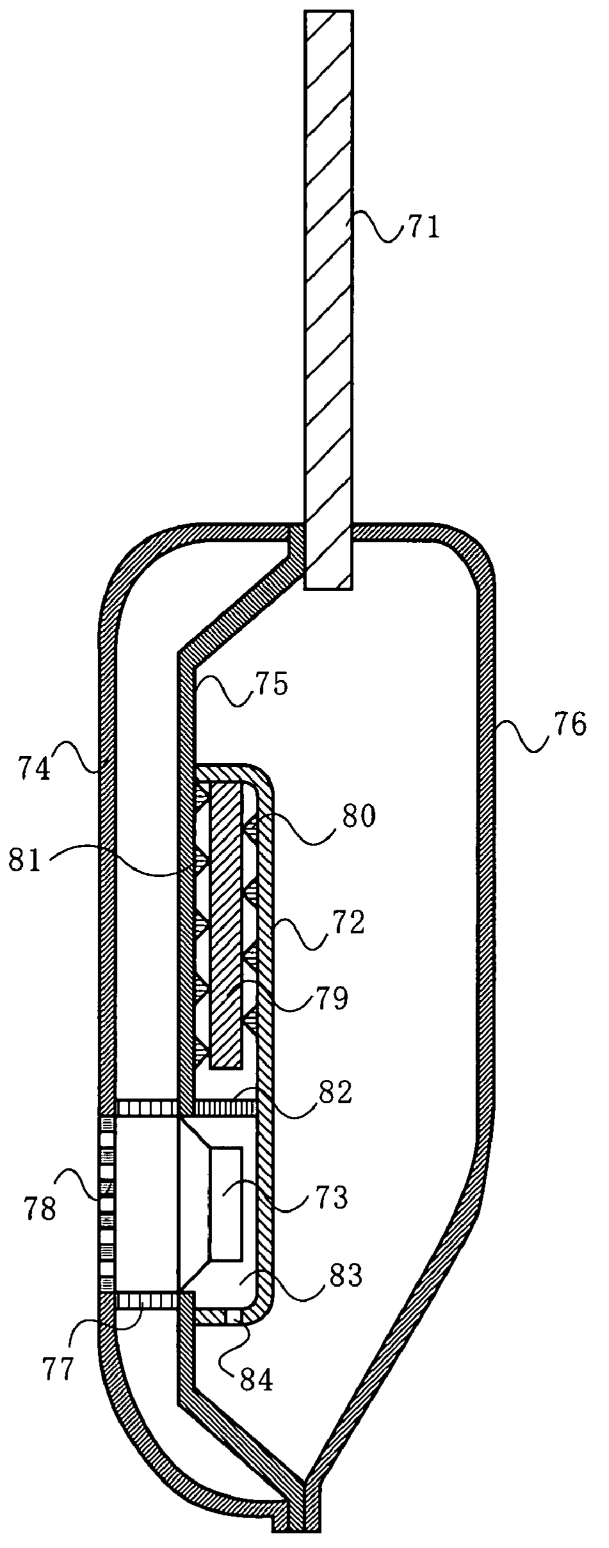
FIG. 11 is a cross-sectional view of a vehicle door viewed from along line G-H of FIG. 10.

Next, as a fifth embodiment, an example of a speaker system mounted on a vehicle will be described. FIG. 10 is a profile of a vehicle door. FIG. 11 is a cross-sectional view of a vehicle door viewed from along line G-H of FIG. 10. In FIG. 10 and FIG. 11, the vehicle door includes a window glass 71, a cabinet 72, a speaker unit 73, an inside wall 74, an inner panel 75, an outer panel 76, an acoustic tube 77, a grille 78, activated carbon 79, protruding sections 80 and 81, and a divider 82.

The inner panel 75 is located between the inside wall 74 and the outer panel 76. The inner panel 75 has a hole which is the same in size as the speaker unit 73, and the speaker unit 73 is fixed to the inner panel 75 so as to be embedded in the hole. The speaker unit 73 is located such that a front face thereof faces the inside wall 74 side. The acoustic tube 77 is connected to a circumference of the hole of the inner panel 75 so as to cover the hole, and the acoustic tube 77 creates a space together with the grille 78 fixed to the inside wall and the front face of the speaker unit 73.

On the other hand, the cabinet 72 is of a box shape whose one face is open, and is connected to the inner panel 75 such that the speaker unit 73 is bounded by the opening portion. The cabinet 72 is located in a space between the inner panel 75 and the outer panel 76. Further, a pore 84 is formed in the cabinet 72. First and second protruding sections 80 and 81 are of a cone shape, and formed in an inside of the cabinet 72. Specifically, the first protruding sections 80 are formed on a side face of an inner circumference of the cabinet 72. The second protruding sections 81 are formed on a side face of the inner panel 75. The activated carbon 79 is located in a chamber 83 in an inside of the cabinet 72, and is clamped by the first protruding sections 80 and the second protruding sections 81. The divider 82 is located between the activated carbon 79 and the speaker unit 73 in an inside of the cabinet 72 so as to divide off an internal space of the cabinet 72. On the divider, a plurality of holes is formed, which is not shown in the drawings.

An action of the speaker system configured as above and mounted on the vehicle door will be described. When a music signal is applied to the speaker unit 73 from an audio device (e.g. a CD player) which is in an inside of the vehicle and is not shown in the drawings, a sound from a front face of the speaker unit 73 is emitted from the grille 78 to the inside of the vehicle. Here, spaces are allocated between one side face of the activated carbon 79 and the cabinet 72 due to the first protruding sections 80. Further, the spaces are allocated between another side face of the activated carbon 79 and the inner panel 75 due to the second protruding sections 81. Therefore, in the fifth embodiment as well, as with the first to the fourth embodiments, it is possible to reduce an acoustic loss caused by the sound transferring through the inside of the activated carbon 79, thereby improving a reproduction sound pressure of the speaker system.

Here, in the fifth embodiment, the first and the second protruding sections 80 and 81 function as spikes, and clamp the activated carbon 79 as if sticking thereto. Accordingly, even if a vehicle body shakes while the vehicle is running, the activated carbon 79 is securely retained by each of the protruding sections 80 and 81. Further, the divider 82 having a plurality of sound holes is located in the chamber 83. With this configuration, even if each of the protruding sections 80 and 81 cannot retain the activated carbon 79 due to shaking of the vehicle, the divider 82 can stop falling of the activated carbon 79. That is, the divider 82 can prevent the activated carbon 79 from completely falling toward the lower direction of the door.

Further, as with the fourth embodiment, the pore 84 is designed to prevent an air expansion caused by a temperature increase of the chamber 83. In the fifth embodiment, the port of the pore 84 is located between the inner panel 75 and the outer panel 76.

As above described, according to the fifth embodiment, it is possible to realize a speaker system which is capable of reproducing a rich bass sound without enlarging a capacity of the cabinet of the speaker system which is mounted in the inside of the vehicle having a limited capacity.

Note that, in the fifth embodiment, the speaker system (the cabinet 72, the speaker unit 73, the activated carbon 79, the protruding sections 80 and 81, and the divider 82) are located at a space between the inner panel 75 and the outer panel 76, but may be located at a space between the inner panel 75 and the inside wall 74. Further, in the fifth embodiment, the example of the speaker system mounted in the vehicle door is shown, but the speaker system may be mounted in a various position of the vehicle such as a front panel, a rear tray, and a ceiling of the vehicle body. In these cases, the shape of the cabinet is required to be appropriate to a shape of the vehicle body, and according to the present invention, it is possible to realize an in-vehicle speaker system which is capable of reproducing the rich bass sound with a sufficient sound pressure even in a small space.

Sixth Embodiment

Figure 12:
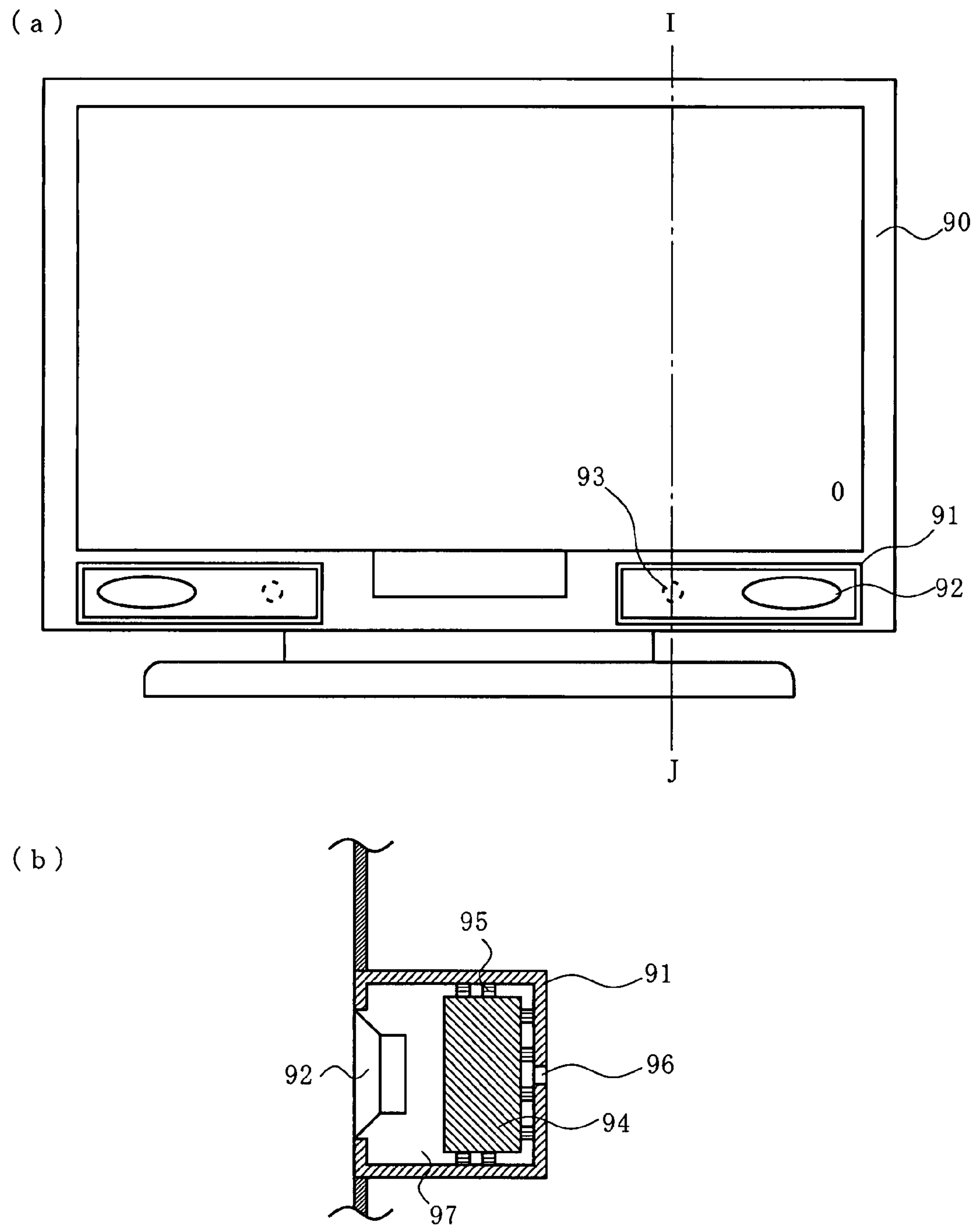
FIG. 12 is a diagram showing a configuration of a flat-screen television according to a sixth embodiment.
Figure 13:
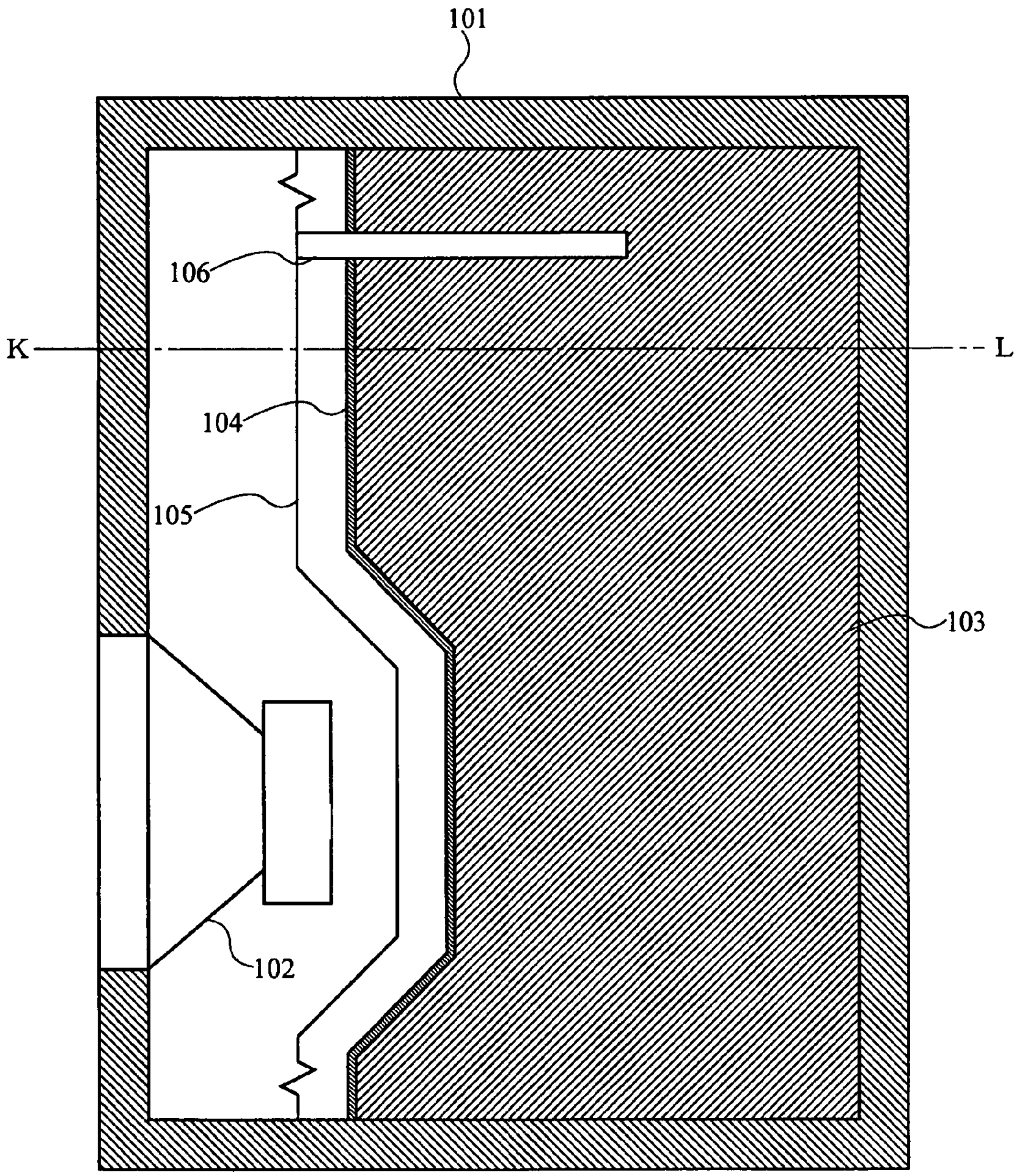
Fig. 13 PRIOR ART
FIG. 13 is a cross-sectional view of a main portion of a speaker system described in Patent Document 1.
Figure 14:
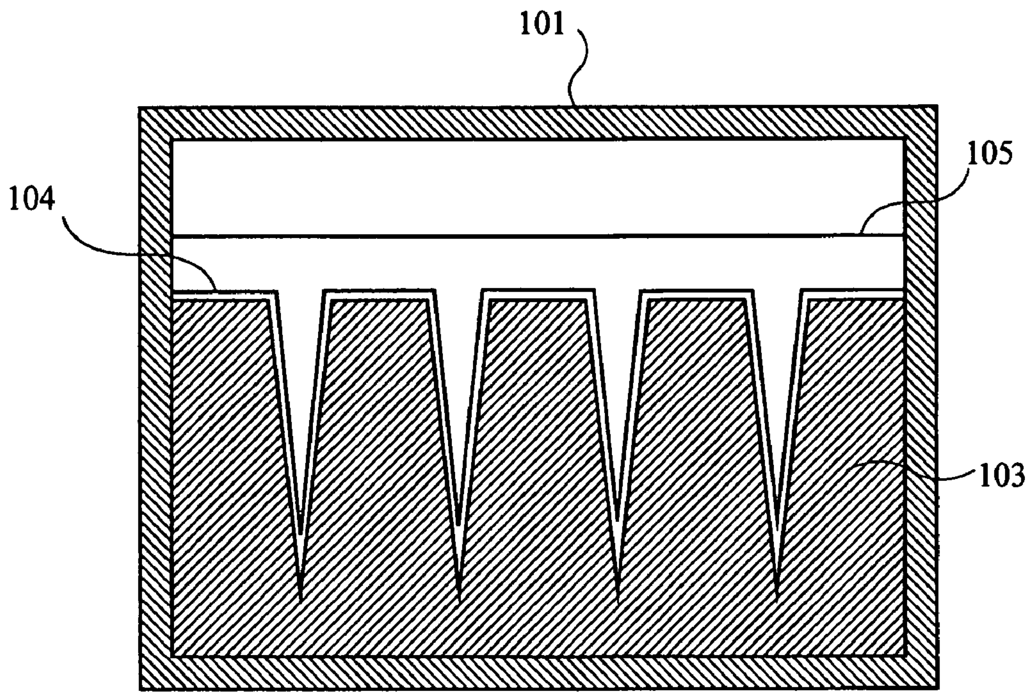
Fig. 14 PRIOR ART
FIG. 14 is a cross-sectional view viewed from along line K-L of FIG. 13.

Next, as a sixth embodiment, an example of speaker systems mounted in a flat-screen television will be described. FIG. 12 is a diagram showing a configuration of the flat-screen television according to the sixth embodiment. Here, FIG. 12(*a*) is a front view of the flat-screen television, and FIG. 12(*b*) is a diagram showing a part of a cross-section of the flat-screen television viewed from along line I-J of FIG. 12(*a*). In FIG. 12, the flat-screen television includes a housing 90 of the flat-screen television, cabinets 91, speaker units 92, pores 93, activated carbons 94, and protruding sections 95.

In the flat-screen television according to the sixth embodiment, speaker systems (the cabinets 91, the speaker units 92, the pores 93, the activated carbon 94, and the protruding sections 95) are located at a lower part of a main body of the television. Specifically, the cabinets 91 are located at a lower side of a screen of the television. Each of the speaker units 92 is fixed to an opening portion of each of the cabinets 91. Each of the speaker units 92 and each of the cabinets 91 form a chamber 97. In the chamber 97, a plurality of the protruding sections 95 is connected to each of the cabinets 91. The activated carbon 94 is supported by the protruding sections 95. In FIG. 12(*b*), a top face, a under face, and a side face of the activated carbon 94 is supported by the protruding sections 95. A pore 96 is formed in each of the cabinet 91. Note that two speaker systems are mounted on the right and left of the flat-screen television. The two speaker systems have a single configuration.

An action of the speaker systems which are mounted in the flat-screen television and configured as above will be described. An acoustic signal from a signal processing section, which is not shown in the drawing, is inputted to the speaker units 92 on the right and left, whereby the speaker units 92 reproduce a sound. Here, spaces are allocated between the top face, the under face, and the side face of the activated carbon 94 and the cabinet 91 due to the protruding sections 95. Therefore, in the sixth embodiment as well, as with the first to fifth embodiments, it is possible to reduce an acoustic loss caused by the sound transferring through the inside of the activated carbon 94, thereby improving a reproduction sound pressure of the speaker system. Further, the pore 96 is formed in the cabinet 91, whereby, as with the fourth embodiment, it is possible to prevent air expansion caused by a temperature increase of the chamber 97.

In the flat-screen television, while a further thinning is required, a large cabinet capacity is required to reproduce the bass sound in the case where a gas adsorbing material such as the activated carbon is not used, which acts as a factor preventing the thinning. Therefore, according to the present invention, with the use of the gas adsorbing material, it is possible to reduce the capacity of the cabinet, and it is also possible to prevent deterioration in a sound pressure level by supporting the gas adsorbing material by the protruding sections, whereby a flat-screen television which is capable of reproducing a rich bass sound can be realized. In the sixth embodiment, the cabinets 91 are located at the lower side of the screen of the flat-screen television, but may be located at both sides of the screen.

As above described, according to the sixth embodiment, the present invention can be applied to a case where it is audio-visual equipment such as a flat-screen television that accommodates the speaker system therein, and the audio-visual equipment which is capable of reproducing the bass sound even in a small space can be realized. Particularly, for a flat-screen television such as of a liquid-crystal panel and a PDP types, which is increasingly thinner, a capacity occupied by the speaker cabinet acts as a factor which prevents thinning and down-sizing of the television set, and thus the present invention is useful.

Further, in the first to sixth embodiments, the protruding sections may be formed in an integrated manner with the cabinet, or may be formed by adhering the protruding sections 11 to the cabinet. In either way, the protruding sections can be created easily, compared to a case of processing the activated carbon into a complex shape.

Further, in the second to sixth embodiments, as with the first embodiment, in addition to fibrous activated carbon, an aggregation of granular activated carbon and a supporting material may be used, or a solidified block of the aggregation of the granular activated carbon may be used as the activated carbon. Further, in the second to the sixth embodiments, in the case where block type activated carbon is used, holes may be formed on the activated carbon such that a traveling direction of a sound generated in the speaker unit coincides with a direction of the holes. Further, in the case of using the block type activated carbon, it may be possible to form the protruding sections in the activated carbon and located the activated carbon in the cabinet such that the protruding sections contact with the cabinet. Further, instead of the activated carbon, other gas adsorbing materials, such as zeolite, silica ($SiO_2$), alumina ($Al_2O_3$), zirconia ($ZrO_3$), magnesia (MgO), triiron tetroxide ($Fe_3O_4$), molecular sieve, fullerene, carbon nanotube, or the like may be used.

Note that, in the above-described fourth to sixth embodiments, the speaker units may be of a any drive system such as an electro-dynamic type, a piezoelectric type, an electrostatic type, and an electromagnetic type. In addition, the speaker unit may be a speaker system according to the third embodiment.

The present invention is compact and available for the purpose of enabling reproduction of a high quality bass sound, and particularly available, for example, to an increasingly thinning liquid crystal television and a PDP (plasma display panel), a stereo device, on-vehicle equipment, a portable terminal device, and the like.

The invention claimed is:

1. A speaker system, comprising:
- a speaker unit;
- a cabinet forming a chamber at a backside of the speaker unit;
- a gas adsorbing material located in the cabinet; and
- a plurality of protruding materials connecting the gas adsorbing material and the cabinet to each other,
- wherein the plurality of protruding materials are located in the cabinet, such that the plurality of protruding materials support a peripheral part of the gas adsorbing material, and such that the plurality of protruding materials prevent the gas adsorbing material from moving during a movement of the speaker system,
- wherein an air gap is formed between the gas adsorbing material and a wall face of the cabinet that is parallel with a traveling direction of a sound emitted from the speaker unit, and
- wherein an interval between the gas adsorbing material and the wall face of the cabinet is fixed by at least a portion of the plurality of protruding materials.

2. The speaker system according to claim 1, wherein the cabinet is integrally formed with a frame of the speaker unit.

3. The speaker system according to claim 1, wherein spaces formed by the plurality of protruding materials are connected to the chamber.

4. The speaker system according to claim 1, wherein the plurality of protruding materials are located on at least one face of the cabinet.

5. The speaker system according to claim 1, wherein the gas adsorbing material is clamped and fixed by the plurality of protruding materials.

6. The speaker system according to claim 1, wherein the gas adsorbing material is formed by activated carbon.

7. The speaker system according to claim 6, wherein the activated carbon is formed by solidifying granular activated carbon.

8. The speaker system according to claim 7, wherein the activated carbon includes holes formed therein that extend from a surface of the activated carbon facing the speaker unit toward a direction away from the speaker unit.

9. The speaker system according to claim 6, wherein the activated carbon is formed by fibrous activated carbon.

10. The speaker system according to claim 1, wherein the speaker unit is any one of an electro-dynamic speaker, a piezoelectric speaker, an electrostatic speaker, and an electromagnetic speaker.

11. The speaker system according to claim 1, wherein, the speaker unit includes:
- a diaphragm arranged to form the chamber within the cabinet; and
- an actuator that is located in the chamber and that causes the diaphragm to vibrate.

12. The speaker system according to claim 11,
- wherein the speaker system further comprises a divider that is located in the chamber and that includes a plurality of sound holes, and
- wherein the gas adsorbing material is supported by the plurality of protruding materials and the divider.

13. A portable terminal device, comprising:

the speaker system described in claim 1; and an equipment housing for retaining the speaker system therein.

14. The portable terminal device according to claim 13, wherein the cabinet includes pores formed therein connecting the chamber to an inside of the equipment housing.

15. Audio-visual equipment, comprising:

the speaker system described in claim 1;

a display device; and an equipment housing for retaining the speaker system therein such that the speaker system is located around the display device.

16. The audio-visual equipment according to claim 15, wherein the cabinet includes pores formed therein connecting the chamber to an inside of the equipment housing.

17. A vehicle, comprising:

the speaker system described in claim 1; and a retaining section for retaining the speaker system and emitting a sound generated by the speaker system into an inside of the vehicle.

18. The vehicle according to claim 17, wherein the retaining section is a shape having a space in an inside thereof, and retains the speaker system in the inside, and wherein the cabinet includes pores formed therein connecting the chamber to the space in the inside of the retaining section.

* * * * *